United States Patent
Pan et al.

(10) Patent No.: US 7,203,894 B2
(45) Date of Patent: Apr. 10, 2007

(54) METHOD OF ESTIMATING RELIABILITY OF DECODED MESSAGE BITS

(75) Inventors: Ju Yan Pan, Singapore (SG); Chang Qing Xu, Singapore (SG); Masayuki Tomisawa, Singapore (SG)

(73) Assignee: Oki Techno Centre (Singapore) Pte Ltd, Singapore (SG)

( * ) Notice: Subject to any disclaimer, the term of this patent is extended or adjusted under 35 U.S.C. 154(b) by 504 days.

(21) Appl. No.: 10/847,285

(22) Filed: May 18, 2004

(65) Prior Publication Data

US 2004/0243903 A1    Dec. 2, 2004

(30) Foreign Application Priority Data

May 30, 2003    (SG)    .............................. 200302783-6

(51) Int. Cl.
*H03M 13/41*    (2006.01)
(52) U.S. Cl. ...................................... 714/780; 714/795
(58) Field of Classification Search ................ 714/780; *H03M 13/41*
See application file for complete search history.

(56) References Cited

U.S. PATENT DOCUMENTS 5,577,053 A    11/1996    Dent
5,881,073 A    3/1999    Wan et al.
6,985,726 B2 *    1/2006    Ahmed et al. ........... 455/432.2

FOREIGN PATENT DOCUMENTS

WO    WO 2004/019498    3/2004

OTHER PUBLICATIONS

"Optimum Decoding of Convolutional Codes—The Viterbi Algorithm," Chapter 8, Block and Convolutional Channel Codes, Digital Communications, John G. Proakis; McGraw-Hill, 3$^{rd}$ Edition; pp. 483-489.
"Multiplexin and Channel Coding (FDD)," RELEASE 5, 3GPP Technical Specification, TS 25.212 V5.2.0 (Sep. 2002); pp. 62-66.
"Viterbi Decoding Algorithm for Convolutional Codes with Repeat Request," Hirosuke Yamamoto and Kohji Itoh; IEEE Transactions on Information Theory; vol. IT-26, No. 5; Sep. 1980; p. 540-547.

* cited by examiner

*Primary Examiner*—R. Stephen Dildine
(74) *Attorney, Agent, or Firm*—Rabin & Berdo, P.C.

(57) ABSTRACT

A method of estimating the reliability of decoded message bits in a digital communications system is proposed. Message and tail bits are coded and transmitted across a communications channel. The coded message and tail bits are then decoded and it is determined that the decoded message bits have no error when the decoded tail bits have at least one error.

16 Claims, 2 Drawing Sheets

METHOD OF ESTIMATING RELIABILITY OF DECODED MESSAGE BITS

FIELD OF THE INVENTION

The present invention relates to a method of estimating reliability of decoded message bits at a decoder side in digital communication, more especially, to estimating reliability of viterbi decoded message bits.

BACKGROUND OF THE INVENTION

In digital communications, the viterbi decoding algorithm is used to decode convolutional coded bits. Convolutional coded bits are generated by passing the message bit sequence through a linear finite-state shift register one symbol at a time. The convolutional encoder is characterized by the length of the shift register, number of input and output bits, and the connections between the shift registers. The viterbi decoding algorithm calculates the log likelihood function for each path at each level of the trellis diagram for the received sequence, and selects the path having the largest log likelihood among those merging at each node of that level, while discarding the other paths. The selected path is called a surviving path. Thereupon, the most likely received message bit sequence is deduced.

A common practice at the transmitter side is to append a sequence of zero bits to the message bits to force the convolutional encoder memory into state zero. Such sequence of bits is known as tail bits, and they are of the same length as the encoder memory. The viterbi decoder uses the tail bits as a priori information to construct a conclusive trellis, namely, the trellis can be "terminated", which means that the number of surviving paths at the end of the trellis can be progressively reduced to only two possibilities.

The method of decoding tail bits is similar to that of decoding message bits. At each node of the tail bits in the trellis, the metrics for all branches are calculated. However, the number of surviving paths at tail bit nodes is no longer equal to the constraint length (i.e., the number of stages in the convolutional encoder), because the number of branches is reduced exponentially at each node. The number of surviving paths at tail bit nodes is half of the number of branches at that node. This is because for binary decoding algorithms, there are two paths at each node of the trellis diagram, and only one branch survives at each node during decoding.

Error detection is needed to detect errors in decoding. It is usually done by appending additional bits, such as CRC bits, to the message bits at the encoder side, and correspondingly adding additional functions, such as a CRC checker, after the decoder. However, transmitting CRC bits is sometimes not a favourable option. In order to avoid transmitting such additional CRC bits, it is preferable to perform an error detection process using only convolutional coded message and tail bits. This requires the viterbi algorithm to be slightly modified.

An example of such a requirement is the 3GPP HSDPA HS-SCCH part I decoding. The decoder at this stage is required to make a decision of whether the decoded bits are reliable or not, without the help of CRC bits. A Viterbi decoding algorithm can calculate the reliability of the decoded bits at any node, including those at the tail bit positions (i.e. the tail bits). Tail bits are known to be all zeros, therefore, if the decoded tail bits are not all zeros, this means that decoding error has occurred in the tail bits and maybe in the message bits.

The Yamamoto-Itoh algorithm is a modified decoding method which allows the viterbi algorithm to calculate the reliability of the decoded message bits. At every level of the trellis, the Yamamoto-Itoh algorithm labels each node in the level as either successful or failure. This is done by calculating the difference between the metrics of the two paths that merge into a node. If the difference is larger than a specified constant, the node is labeled as successful; if not, it is labeled as failure. The decoding is considered to be erroneous if all nodes are labeled as failure at any level.

This algorithm requires computation in addition to the viterbi algorithm at every level (i.e. at the decoding of every message symbol). Therefore, the complexity of this algorithm increases linearly with the number of message bits.

SUMMARY OF THE INVENTION

The present invention provides an improved method of estimating reliability of the decoded message bits with less computation complexity and high accuracy.

The method of the invention uses the observation of only the decoded tail bits to calculate the reliability of the decoded message bits.

In accordance with the present invention, there is provided a method of estimating the reliability of decoded message bits in a digital communications system comprising the steps of: coding message and tail bits; transmitting the coded message and tail bits across a communications channel; decoding the coded message and tail bits; and determining that the decoded message bits have no error when the decoded tail bits have at least one error.

Preferably, the method further comprises the step of assuming that the decoded message bits have no error when the decoded tail bits have no error.

Preferably, the method further comprises the step of statistically determining whether the decoded message bits have at least one error or no error when the decoded tail bits are determined to have at least one error.

Preferably, the statistical determination is made by beforehand simulations of the ratio of: a) the probability of the event of having decoded message bits having no errors and having decoded tail bits having at least one error, relative to b) the probability of the event of having decoded message bits having at least one error and having decoded tail bits having at least one error.

Preferably, the method further comprises the steps of: counting number of errors in sets of the decoded tail bits; determining the decoded message bits to be error free if the number of errors in a set of the decoded tail bits is zero; computing the likelihood of the set of the decoded tail bits if the number of errors in the set of the decoded tail bits is non-zero; comparing the likelihood with a predetermined threshold; and deciding whether the decoded message bits are error free according to the result of the comparison.

Preferably, the step of computing the likelihood comprises steps of: determining error categories of the decoded message bits and decoded tail bits; calculating probability of the occurrence of each error category; calculating probability of the occurrence of each set of the decoded tail bits for each error category; calculating the likelihood of the set of the decoded tail bits by using the probabilities obtained.

Preferably, the error categories include the event of message bits having no errors and tail bits having at least one error, and the event of message bits having at least one error and tail bits having at least one error.

Preferably, the likelihood of the set of the decoded tail bits is the ratio of the probabilities of occurrences of each error category for the set of the decoded tail bits.

Preferably, the step of computing the likelihood of the set of the decoded tail bits is implemented by: L(t)=P(event A1-B2|t)/P(event A2-B2|t)=(P(t|event A1-B2) P(event A1-B2))/(P(t|event A2-B2) P(event A2-B2)), where, event A1-B2 is the event of message bits having no errors and tail bits having at least one error, event A2-B2 is the event of message bits having at least one error and tail bits having at least one error, P(event A1-B2|t) is the probability of the occurrence of the event A1-B2 for the set of the decoded tail bits t, P(event A2-B 2|t) is the probability of the occurrence of the event A2-B2 for the set of the decoded tail bits t, P(t|event A1-B2) is the probability of occurrence of the set of the decoded tail bits t for event A1-B2, P(event A1-B2) is the probability of occurrence of event A1-B2, P(t|event A2-B2) is the probability of occurrence of the set of the decoded tail bits t for event A2-B2, P(event A2-B2) is the probability of occurrence of event A2-B2.

Preferably, the step of deciding whether the decoded message bits are error free according to the result of the comparison includes deciding the decoded message bits to be error free if the likelihood of the set of the decoded tail bits is larger than the threshold.

Preferably, the decoded message bits are Viterbi decoded message bits.

Preferably, the decoded tail bits are Viterbi decoded tail bits.

In accordance with a second aspect of the present invention, there is provided a digital communications system for estimating the reliability of decoded message bits in a digital communications system, comprising: means for coding message and tail bits; means for transmitting the coded message and tail bits across a communications channel; means for decoding the coded message and tail bits; and means for determining that the decoded message bits have no error when the decoded tail bits have at least one error.

In accordance with the third aspect of the present invention, a post-decoder for estimating the reliability of decoded message bits in a digital communications system, comprising: means for receiving coded message and tail bits from a communications channel; means for decoding the coded message and tail bits; means for determining that the decoded message bits have no error when the decoded tail bits have at least one error; and means for outputting the determination result.

Preferably, the means for determining further comprises means for statistically determining whether the decoded message bits have at least one error or no error when the decoded tail bits are determined to have at least one error.

Preferably, the means for statistically determining comprises means for beforehand simulating the ratio of: a) the probability of the event of having decoded message bits having no errors and having decoded tail bits having at least one error, relative to b) the probability of the event of having decoded message bits having at least one error and having decoded tail bits having at least one error.

The method of the present invention reduces the computation complexity because it possesses the following attributes:

1. The method only executes its most time-consuming computation in the event that the decoded tail bits have at least one error. This situation occurs only about 10% of the time under desirable conditions.

2. The complexity of this most time-consuming computation increases exponentially with the number of tail bits, instead of message bits. Tail bits are usually much shorter than message bits.

DETAILED DESCRIPTION OF THE PREFERRED EMBODIMENTS OF THE INVENTION

The method of estimating the reliability of the decoded message bit is now explained in accordance with the first embodiment of the present invention.

Certain values need to be calculated beforehand (i.e. not at real time). The reliability of the message bits can be computed using the decoded tail bits output by hard-decision and a table for memorizing the values.

Here, we define message bits $b=\{b_1,b_2,b_3, \ldots ,b_N\}$ and tail bits $t=\{t_1,t_2,t_3, \ldots ,t_T\}$ (with N=message length and T=tail length) as decoded bits with the Viterbi algorithm. Errors, if any, may occur in either message bits b or tail bits t, but since t is not part of the intended message, the decoding is successful if at least b is known to be error free.

Figure 1:
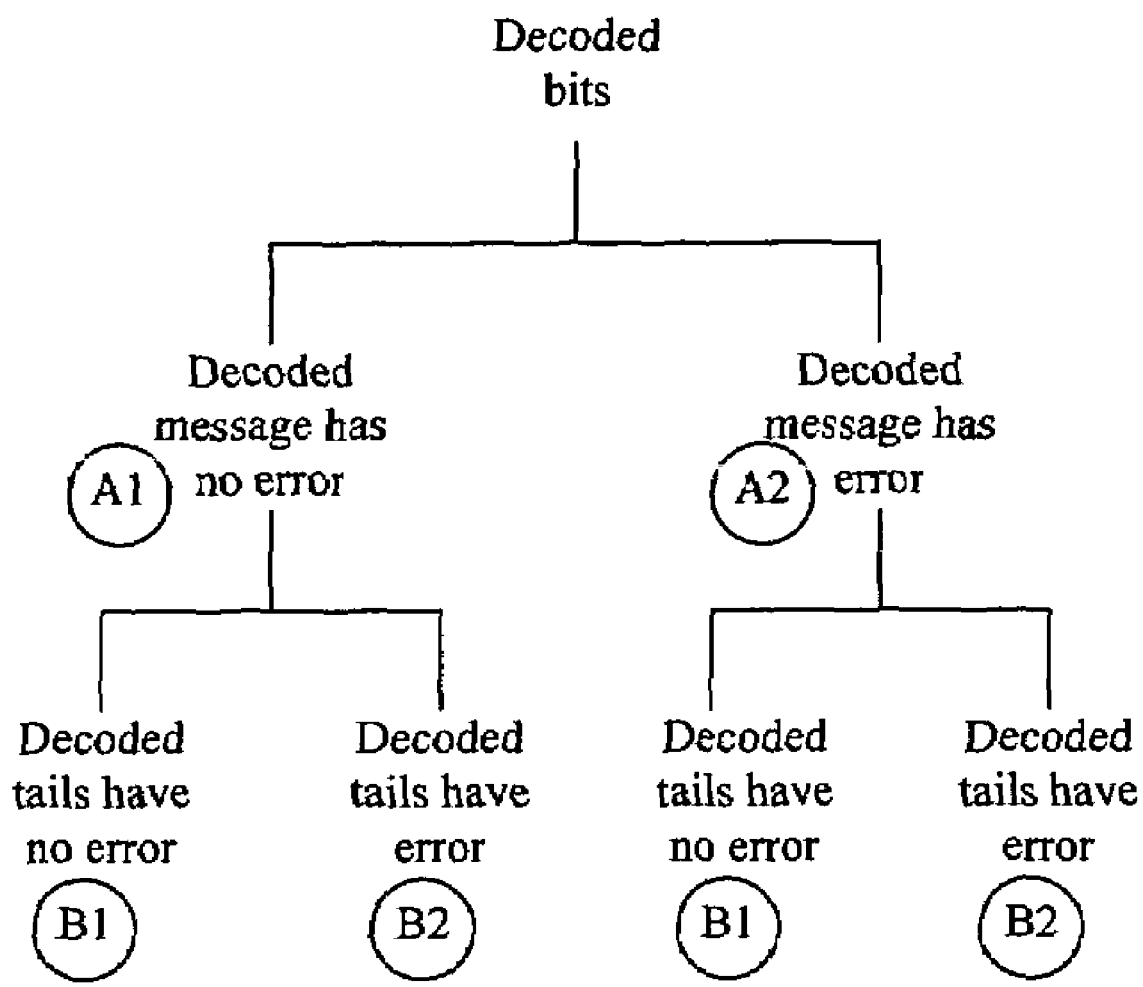
FIG. 1 illustrates four different possible routes given two different outcomes for each message decoding and tail bit decoding.

Given the viterbi decoded bits (i.e. both decoded message and tail bits), we can use the decoded tail bits t to try to estimate whether at least one error had occurred in the decoded message bits b. We now define four events to represent the reliability of the message bits t and tail bits b. Namely, event A1-B 1 represents that message bits are error free and tail bits are error free; event A1-B2 represents that message bits are error free and tail bits have at least one error; event A2-B1 represents that message bits have at least one error and tail bits are error free; and event A2-B2 represents that message bits have at least one error and tail bits also have at least one error. The event tree diagram in FIG. 1 illustrates the four different events for each message decoding and tail bit decoding.

The method of the present invention has the ability to count the number of errors in the t since they are known to be all zeros at the encoder side. Determining whether or not that t has at least one error is helpful to trace back which event illustrated in FIG. 1 had occurred.

Event A1-B1 is a desired event, and it should occur very often (nearly 90% or more of the time for a target FER (frame error rate) of less than 0.1). But it can be confused with event A2-B1, which is an undesirable event—because these two events are detected by the same way, namely, by detecting that t has no error. In view of this, as well as the possibility of occurrence of event A2-B1 is much lower than of even A1-B1, the method of the present invention assumes that the decoded message bits are error free if the decoded tail bits have no errors.

Similarly, event A1-B2 and event A2-B2 also cannot be distinguished just by detecting that t has at least one error. Therefore, in order to distinguish between events A1-B2 and A2-B2, the probabilities of occurrence of events A1-B2 and A2-B2 based on the observation of a set of t are calculated using Bayes' Theorem:

$$P(\text{event } A1 - B2 \mid t = \{t_1, t_2, \ldots, t_T\}) \quad (1)$$
$$= P(t = \{t_1, t_2, \ldots, t_T\} \mid \text{event } A1 - B2)$$
$$P(\text{event } A1 - B2) / P(t = \{t_1, t_2, \ldots t_T\})$$

$$P(\text{event } A2 - B2 \mid t = \{t_1, t_2, \ldots, t_T\}) \quad (2)$$
$$= P(t = \{t_1, t_2, \ldots, t_T\} \mid \text{event } A2 - B2)$$
$$P(\text{event } A2 - B2) / P(t = \{t_1, t_2, \ldots, t_T\})$$

where a set of t is one of $\{\{0,0,\ldots,0,0,0\}, \{0,0,\ldots,0,0,0\}, \ldots, \{0,0,\ldots,0,0,0\}\}$ (i.e. any of $2^T$ combinations of decoded tail bits).

The likelihood of t, which is the ratio of (1) over (2), indicates which event is more likely:

$$L(t)=P(\text{event } A1\text{-}B2\mid t)/P(\text{event } A2\text{-}B2\mid t) \quad (3)$$

if $L(t)>1 \Rightarrow$ event A1-B2 is more likely $\Rightarrow$ b has no error (event A1)

if $L(t)<\oplus \Rightarrow$ event A2-B2 is more likely $\Rightarrow$ b has error (event A2)

Considering the equations (1) and (2), equation (3) is implemented by computing:

$$L(t) = (P(t \mid \text{event } A1 - B2) P(\text{event } A1 - B2)) / \quad (4)$$
$$(P(t \mid \text{event } A2 - B2) P(\text{event } A2 - B2))$$
$$= (P(t \mid \text{event } A1 - B2) / (P(t \mid \text{event } A2 - B2))$$
$$(P(\text{event}A1 - B2) / P(\text{event}A2 - B2))$$

The ratios (P(t|event A1-B2)/P(t|event A2-B2)) and (P(event A1-B2)/P(event A2-B2)) can be either measured by simulations beforehand or computed theoretically as described in 'Digital Communications', 3$^{rd}$ edition, by John G. Proakis et. The simulations here refer to computer simulations of a basic communication system consisting of all the relevant components described in the present invention (i.e. convolutional encoder, viterbi decoder, etc . . . ). They are dependent on SNR, message length, and encoder type. Generally, the possibility of t having at least one error would be different for different encoders at different SNR. For example, a better encoder (i.e., more complex encoder) with longer message length at higher SNR would reduce the possibility of t having at least one error.

For a fixed set of SNR, message length and encoder type, there are $2^T$ values of (P(t|event A1-B2)/P(t|event A2-B2)) and one value of (P(event A1-B2)/P(event A2-B2)).

Figure 2:
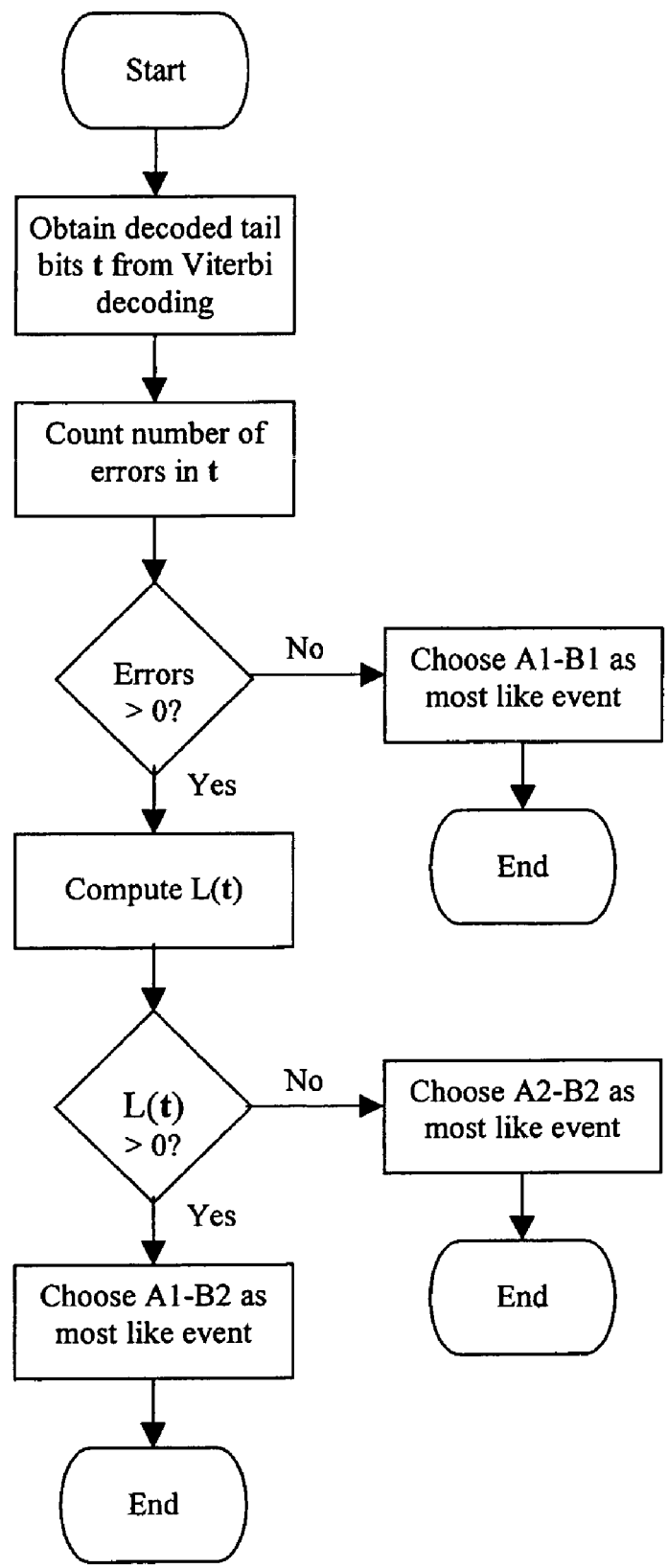
FIG. 2 is a flow chart illustrating the procedure of estimating the reliability of decoded message bits in accordance with the first embodiment of the present invention.

The flowchart in FIG. 2 illustrates the procedure of the method of the present invention for one frame of decoded message bits and tail bits (i.e. one set of b and t), starting from right after the Viterbi decoding.

Below is an example of the implementation of the method of the present invention:

Sequences of message bits and tail bits (for each sequence, the length of message bits N=8 and the length of tail bits T=8) are convolutionally encoded according to the 3GPP technical specification, TS 25.212 v520 (2002-09), titled "Multiplexing And Channel Coding (FDD) (Release 5)", September 2002. The encoded bits are BPSK modulated and transmitted across an AWGN (Add White Gaussian Noise) channel.

At the decoder side, a soft-decision Viterbi decoder constructed according to the specification of 'Digital Communications' by John G. Proakis, 3$^{rd}$ edition, is used to decode the received signal to provide sequences of decoded message bits and tail bits.

From simulations (beforehand) at Eb/No=2 dB, the following probabilities are obtained by counting the number of occurrences of events A1-B1, A1-B2, A2-B1, and A2-B2:

P(A1-B1)=0.8557
P(A1-B2)=0.1173
P(A2-B1)=0.00004
P(A2-B2)=0.027

Then, the frame error rate (FER) is P(A2-B1)+P(A2-B2) =0.02704. From the same beforehand simulation, the values of P(t|A1-B2) and P(t|A2-B2) for all $2^8$=256 sets of t are also obtained by counting the number of occurrences of t whenever A1-B2 or A2-B2 occurs—for example, P(t={0,0,0,0,0,0,0,0}|A2-B2)=0.0013
P(t={0,0,0,0,0,0,0,1}|A2-B2)=0.0019
P(t={0,0,0,0,0,0,1,0}|A2-B2)=0.0015, etc . . .

The sum of all 256 P(t|A1-B2) or P(t|A2-B2) must be 1. Here, one set of t has T=8 tail bits.

All these probabilities (except P(A1-B1) and P(A2-B1)), which can be obtained beforehand, are memorized in the above-mentioned look-up table.

Then, the number of errors in each set of t is obtained by counting the number of 1's in the set of t. If the number of errors in a set of t is zero, then event A1-B 1 is chosen as the most likely event. If not, the likelihood of t, L(t), is computed. Taking a set of t={1,1,0,1,0,0,0,0} as an example, the procedure of computation of L(t) is explained:

$$L(t) = P(\text{event } A1 - B2 \mid t = \{1, 1, 0, 1, 0, 0, 0, 0\}) /$$
$$P(\text{event } A2 - B2 \mid t = \{1, 1, 0, 1, 0, 0, 0, 0\})$$
$$= P(t = \{1, 1, 0, 1, 0, 0, 0, 0\} \mid A1 - B2) /$$
$$P(t = \{1, 1, 0, 1, 0, 0, 0, 0\} \mid A2 - B2) \times$$
$$(P(A1 - B2) / P(A2 - B2))$$
$$= (0.012 / 0.0019) \times (0.1173 / 0.027)$$
$$= 27.4$$
$$> 1$$

Therefore, event A1-B2 is chosen as the most likely event.

All of the above process can be implemented by a post-decoder which is positioned in the receiver. In other words, the post-decoder is used to estimate the reliability of the message bits after viterbi decoding and output the result for the estimation. For this example, no matter which one of events A1-B1 or A1-B2 is estimated to be most likely event, the post-decoder declares that the decoded message bits are error free. If event A2-B2 is estimated to be most likely event, namely, in the case that L(t)<1, then the post-decoder declares that the decoded message bits have at least one error.

As explained before, the invention has a low computation complexity because the post-decoder:

1. Uses the observation of only the decoded tail bits;
2. Executes its most complex computation of determining L(t) only for selected events (events A1-B2 and A2-B2 which occur only about 10% of the time);
3. Most of the time, executes only a very simple computation by counting the number of 1's in each set of t (event A1-B1 and A2-B1, about 90% of the time)

The most complex computation is exponential with the number of decoded tail bits T, because the number of sets of tail bits is exponential with the number of decoded tail bits T.

The following five tables (Eb/No=0dB, . . . ,4 dB) list the simulation results of the post-decoder operation using the same conditions as explained in the above example. For all sets of the decoded tail bits, the actual probability of occurrence of events A1-B1, A1-B2, A2-B1 and A2-B2 are compared with the decision made by the post-decoder. It can be seen that the number of agreements between the number of actual occurrences and the decision made by the post-decoder is high.

For example, at Eb/No=2 dB (corresponding to the acceptable FER performance of 0.027), the post-decoder correctly predicts event A1-B1 100% of the time, event A1-B2 97% of the time, and event A2-B2 82% of the time.

|  | Event A1-B1 | Event A1-B2 | Event A2-B1 | Event A2-B2 |
|---|---|---|---|---|
| EB/No = 0dB | | | | |
| Actual occurrence (%) | 58.75 | 23.44 | 0.04 | 17.78 |
| Post-decoder decision (%) | 58.79 | 23.95 | 0.00 | 17.27 |
| Number of agreements between actual and post-decoder (%) | 100.00 | 90.64 | 0.00 | 84.81 |
| Eb/No = 1dB | | | | |
| Actual occurrence (%) | 74.01 | 17.91 | 0.02 | 8.61 |
| Post-decoder decision (%) | 74.02 | 18.28 | 0.00 | 7.70 |
| Number of agreements between actual and post-decoder (%) | 00.00 | 94.73 | 0.00 | 78.44 |
| Eb/No = 2d8 | | | | |
| Actual occurrence (%) | 85.57 | 11.73 | 0.004 | 2.70 |
| Post-decoder decision (%) | 85.57 | 11.92 | 0.00 | 2.51 |
| Number of agreements between actual and post-decoder (%) | 100.00 | 97.38 | 0.00 | 81.65 |
| Eb/No = 3dB | | | | |
| Actual occurrence (%) | 92.76 | 6.63 | 0.00 | 0.61 |
| Post-decoder decision (%) | 92.76 | 6.50 | 0.00 | 0.74 |
| Number of agreements between actual and post-decoder (%) | 100.00 | 97.26 | 0.00 | 92.57 |
| Eb/No = 4dB | | | | |
| Actual occurrence (%) | 96.60 | 3.32 | 0.00 | 0.09 |
| Post-decoder decision (%) | 96.60 | 3.28 | 0.00 | 0.13 |
| Number of agreements between actual and post-decoder (%) | 100.00 | 98.82 | 0.00 | 93.62 |

In second embodiment of the present invention, the post-decoder memorize all the sets of t's which correspond to L(t)>1. For example, if there are 256 sets of t's, then all of the 256 L(t) values are memorized. Therefore, only the sets of t's, whose corresponding L(t) is larger than 1, are selected and memorized. Using this technique, we can skip the computation of L(t) during real time, and also do not have to memorize P(A1-B2) and P(A2-B2).

In third embodiment of the present invention, the post-decoder memorizes the sets of t's which correspond to L(t)>C, where C is a constant larger than 1. Using this technique, the memory size is reduced (since there are fewer t's) while the error detection performance can still be maintained at a high level. In summary, the method of estimation reliability of decoded message bits has been disclosed which can reduce the computation complexity while maintaining high accuracy. The scope of the invention is not restricted to the described embodiments. For example, the method of the present invention can be extended to other encoding and decoding algorithms. The definition of the likelihood of tail bits, L(t), can be reversed into the ratio of equation (2) over (1), namely, L(t)=P(event A1-B2|t)/P(event A2-B2|t). Then, the post-decoder determination event A1-B2 is more likely if L(t)<1.

Numerous other modifications, changes, variations, substitutions and equivalents will therefore occur to those skilled in the art without departing from the scope of the present invention as defined by the following claims.

The invention claimed is:

1. A method of estimating the reliability of decoded message bits in a digital communications system comprising the steps of:
    coding message and tail bits;
    transmitting the coded message and tail bits across a communications channel;
    decoding the coded message and tail bits; and
    determining that the decoded message bits have no error when the decoded tail bits have at least one error.

2. The method of claim 1, further comprising the step of assuming that the decoded message bits have no error when the decoded tail bits have no error.

3. The method of claim 1, further comprising the step of statistically determining whether the decoded message bits have at least one error or no error when the decoded tail bits are determined to have at least one error.

4. The method of claim 2, wherein the statistical determination is made by beforehand simulations of the ratio of:
    a) the probability of the event of having decoded message bits having no errors and having decoded tail bits having at least one error, relative to
    b) the probability of the event of having decoded message bits having at least one error and having decoded tail bits having at least one error.

5. The method of claim 1, further comprising the steps of:
    counting number of errors in sets of the decoded tail bits;
    determining the decoded message bits to be error free if the number of errors in a set of the decoded tail bits is zero;
    computing the likelihood of the set of the decoded tail bits if the number of errors in the set of the decoded tail bits is non-zero;
    comparing the likelihood with a predetermined threshold; and
    deciding whether the decoded message bits are error free according to the result of the comparison.

6. The method of claim 5, wherein the step of computing the likelihood comprises steps of:
    determining error categories of the decoded message bits and decoded tail bits;
    calculating probability of the occurrence of each error category;
    calculating probability of the occurrence of each set of the decoded tail bits for each error category;

calculating the likelihood of the set of the decoded tail bits by using the probabilities obtained.

7. The method of claim 6, wherein the error categories include the event of message bits having no errors and tail bits having at least one error, and the event of message bits having at least one error and tail bits having at least one error.

8. The method of claim 6, wherein the likelihood of the set of the decoded tail bits is the ratio of the probabilities of occurrences of each error category for the set of the decoded tail bits.

9. The method of claim 5, wherein the step of computing the likelihood of the set of the decoded tail bits is implemented by:

$$L(t)=P(\text{event } A1\text{-}B2|t)/P(\text{event } A2\text{-}B2|t)=(P(t|\text{event } A1\text{-}B2)\ P(\text{event } A1\text{-}B2))\ /\ (P(t|\text{event } A2\text{-}B2)\ P(\text{event } A2\text{-}B2))$$

where, event A1-B2 is the event of message bits having no errors and tail bits having at least one error, event A2-B2 is the event of message bits having at least one error and tail bits having at least one error, P(event A1-B2|t) is the probability of the occurrence of the event A1-B2 for the set of the decoded tail bits t, P(event A2-B2|t) is the probability of the occurrence of the event A2-B2 for the set of the decoded tail bits t, P(t|event A1-B2) is the probability of occurrence of the set of the decoded tail bits t for event A1-B2, P(event A1-B2) is the probability of occurrence of event A1-B2, P(t|event A2-B2) is the probability of occurrence of the set of the decoded tail bits t for event A2-B2, P(event A2-B2) is the probability of occurrence of event A2-B2.

10. The method of claim 5, wherein the step of deciding whether the decoded message bits are error free according to the result of the comparison includes deciding the decoded message bits to be error free if the likelihood of the set of the decoded tail bits is larger than the threshold.

11. The method of claim 1, wherein the decoded message bits are Viterbi decoded message bits.

12. The method of claim 1, wherein the decoded tail bits are Viterbi decoded tail bits.

13. A digital communications system for estimating the reliability of decoded message bits in a digital communications system, comprising:
means for coding message and tail bits;
means for transmitting the coded message and tail bits across a communications channel;
means for decoding the coded message and tail bits; and
means for determining that the decoded message bits have no error when the decoded tail bits have at least one error.

14. A post-decoder for estimating the reliability of decoded message bits in a digital communications system, comprising:
means for receiving coded message and tail bits from a communications channel;
means for decoding the coded message and tail bits;
means for determining that the decoded message bits have no error when the decoded tail bits have at least one error; and
means for outputting the determination result.

15. The post-decoder of claim 14, wherein the means for determining further comprises means for statistically determining whether the decoded message bits have at least one error or no error when the decoded tail bits are determined to have at least one error.

16. The post-decoder of claim 15, wherein the means for statistically determining comprises means for beforehand simulating the ratio of:
a) the probability of the event of having decoded message bits having no errors and having decoded tail bits having at least one error, relative to
b) the probability of the event of having decoded message bits having at least one error and having decoded tail bits having at least one error.

* * * * *